United States Patent [19]

Ishimitsu et al.

[11] Patent Number: 5,396,562
[45] Date of Patent: Mar. 7, 1995

[54] SIGNAL PROCESSING CIRCUIT FOR AUDIO APPARATUS

[75] Inventors: Shunsuke Ishimitsu; Hisashi Kihara; Shuichi Mori, all of Saitama, Japan

[73] Assignee: Pioneer Electronic Corporation, Tokyo, Japan

[21] Appl. No.: 227,570

[22] Filed: Apr. 14, 1994

Related U.S. Application Data

[63] Continuation of Ser. No. 904,329, Jun. 25, 1992, abandoned.

[30] Foreign Application Priority Data

Sep. 10, 1991 [JP] Japan ................. 3-230075

[51] Int. Cl.⁶ ............... H03G 3/00; H03G 7/00
[52] U.S. Cl. ................... 381/107; 333/14
[58] Field of Search .......... 381/104, 109, 68.4

[56] References Cited

U.S. PATENT DOCUMENTS 4,271,499 6/1981 Leveque .................. 455/72
4,752,960 6/1988 Scholz ..................... 381/61
4,947,133 8/1990 Thomas .................. 328/162

Primary Examiner—Curtis Kuntz
Assistant Examiner—Ping W. Lee
Attorney, Agent, or Firm—Sughrue, Mion, Zinn, Macpeak & Seas; Richard C. Turner; Marie-Claire Boisvert

[57] ABSTRACT

A signal processing circuit for an audio apparatus has a variable gain amplifier whose gain is varied in accordance with a gain controlling signal supplied thereto. The signal processing circuit comprises a gain setting section having a plurality of tables of input-output characteristics according to a level of loudness selected by a user. The characteristics being for the variable gain amplifier. A table selecting section selects a corresponding one of the plurality of input-output characteristics in accordance with the selected level of loudness. The table selecting section supplies the corresponding input-output characteristic to the variable gain amplifier so as to set the variable gain amplifier for a gain corresponding to the input-output characteristic.

7 Claims, 5 Drawing Sheets

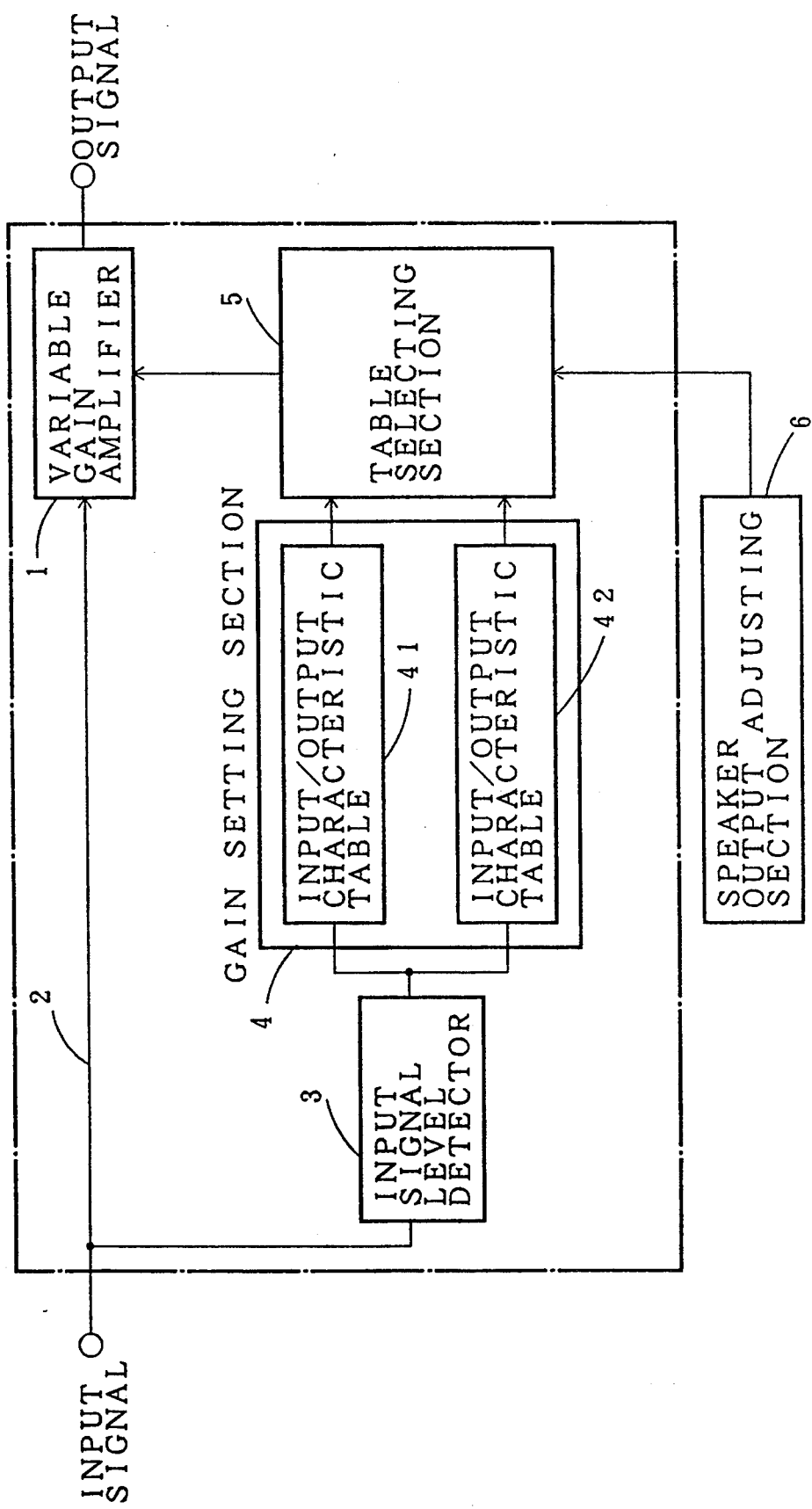

SIGNAL PROCESSING CIRCUIT FOR AUDIO APPARATUS

This is a Continuation of Application No. 07/904,329 filed Jun. 25, 1992, now abandoned.

BACKGROUND OF THE INVENTION

1. Field of the Invention

The present invention relates to a signal processing circuit such as compressors, limiters, and expanders where the level of an output signal is controllably varied in accordance with the level of an input signal.

2. Prior art

Listening characteristics of conventional audio equipment such as CD players, digital audio tape recorders, cassette tape players, and radio tuners are greatly different according to sound sources (classical music, jazz, popular music, conversation, etc.) and listening environments (in a room, on the train, in a car).

It is difficult to hear quieter parts of a tune being played in a noisy environment such as cars and trains. Increasing the volume of a reproduced signal to an audible level may cause sounds which are too loud for relatively louder parts of the tune. On the other hand, the volume cannot be increased too much when listening in a very quiet place, making it difficult to listen to the details of quieter parts.

In order to eliminate the aforementioned problems, ordinary audio equipment is provided with a compressor where the output signal is compressed in dynamic range, a limiter where the maximum level of the output is limited, or an expander where the dynamic range of the output signal is expanded.

FIG. 5 shows a compressor used in a conventional audio system. The compressor has a variable gain amplifier 52 placed in a signal line 51, an input level detector 53 for detecting the level of an input signal, and a gain setting section 54 having a previously determined input vs output table as shown in FIG. 6.

The input level detector 53 detects the level of the input signal to cause the table in FIG. 6 to output a corresponding gain of the amplifier 52, so that the gain of amplifier 52 is controllably varied to effect compression of signal with the input-output characteristic shown in FIG. 6. In this manner, the dynamic range of the output signal is compressed such that the volume of quieter parts of a tune is increased while the louder parts being decreased. The conventional audio system uses only one previously determined table of input-output characteristics for compressing dynamic range and therefore suffers from the following drawbacks.

Compressing the dynamic range with the characteristic shown in FIG. 6 tends to make the quieter parts of a tune more noticeable than the louder parts. Accordingly, when the overall volume is increased, some input-output characteristics may emphasize not only quieter parts of a tune but also hiss noise and background noise, and may cause clipping of louder parts at subsequent amplifiers and speakers. When the overall volume is decreased, some input-output characteristics may cause the quieter parts to be masked in the background noise. Thus, the effect of compression is not always the same but different depending on the volume settings of an audio system. The use of a single input-output characteristic table is not sufficient for desired overall compression effect on all possible settings of volume. The same is true of limiters and expanders.

SUMMARY OF THE INVENTION

An object of the invention is to provide a signal processing circuit where an input-output characteristic is selected in accordance with the volume setting of an audio system, thereby effecting optimum signal processing for all possible volume settings.

A signal processing circuit for an audio apparatus has a variable gain amplifier whose gain is varied in accordance with a gain controlling signal supplied thereto. The signal processing circuit comprises a gain setting section having a plurality of tables of input-output characteristics according to a level of loudness selected by a user. The characteristics being for the variable gain amplifier. A table selecting section selects a corresponding one of the plurality of input-output characteristics in accordance with the selected level of loudness. The table selecting section supplies the corresponding input-output characteristic to the variable gain amplifier so as to set the variable gain amplifier for a gain corresponding to the input-output characteristic.

BRIEF DESCRIPTION OF THE DRAWINGS

Features and other objects of the invention will be more apparent from the description of the preferred embodiments with reference to the accompanying drawings in which:

FIG. 1A shows an embodiment of a compressor for an audio system according to the invention;

DETAILED DESCRIPTION OF PREFERRED EMBODIMENT

Construction

Figure 1B:
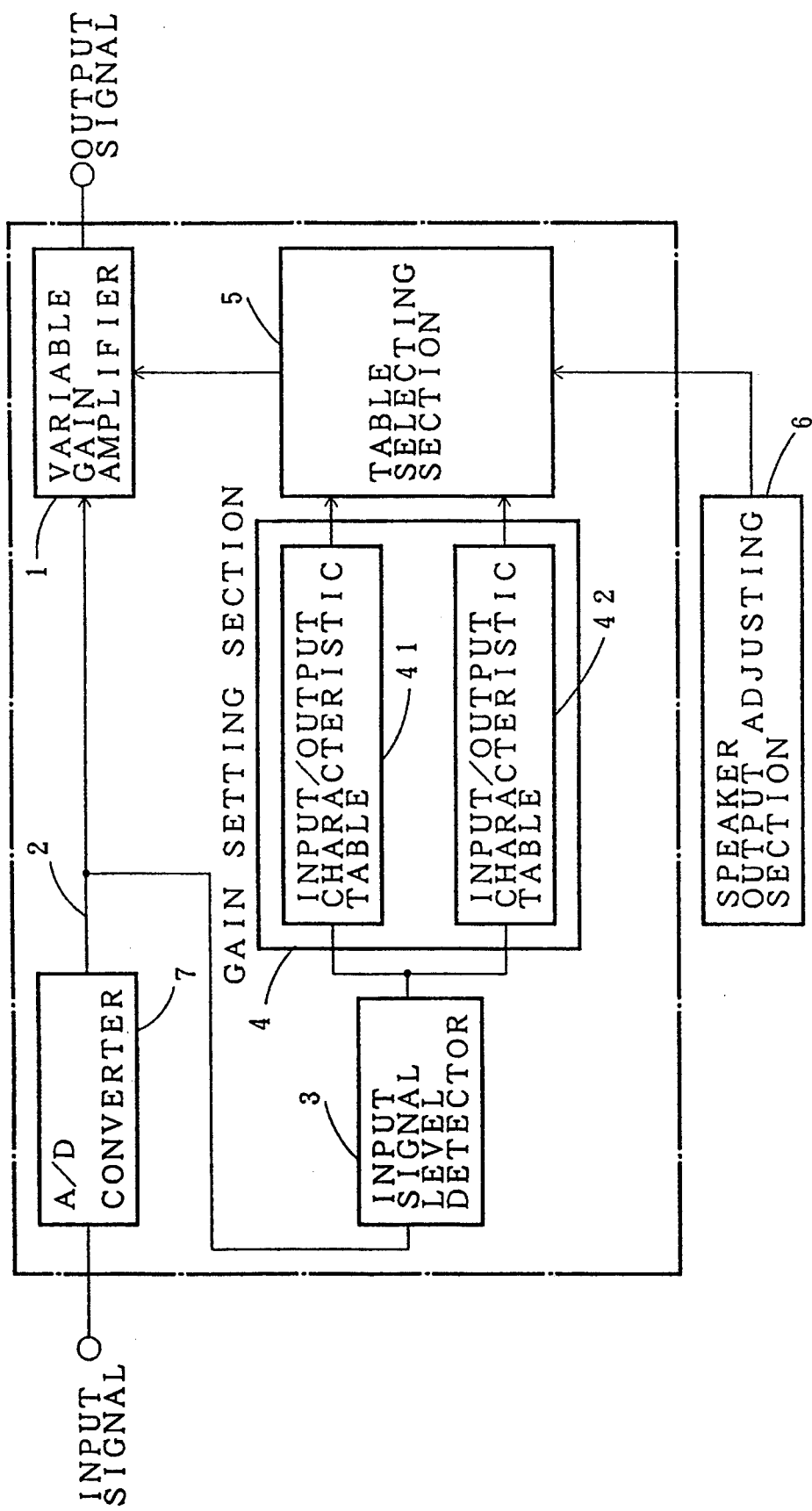
FIG. 1B shows an embodiment of a compressor having an A/D converter.
Figure 2A:
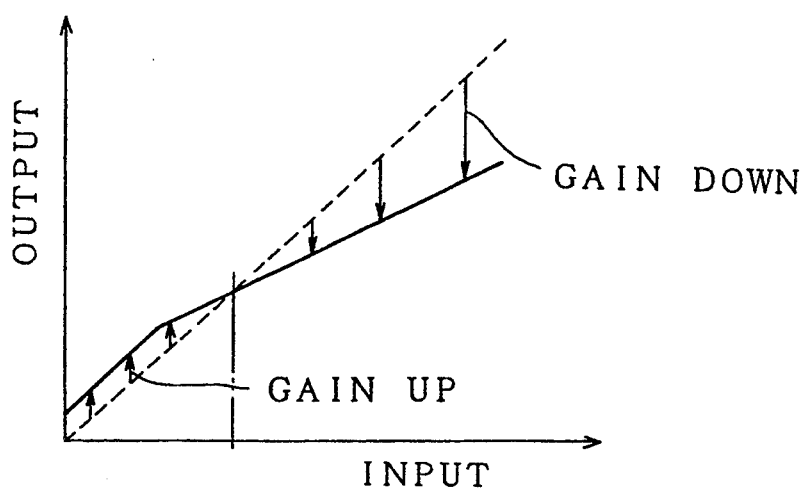
FIG. 2A shows a curve for relatively high loudness levels and FIG. 2B for relatively low loudness levels.
Figure 2B:
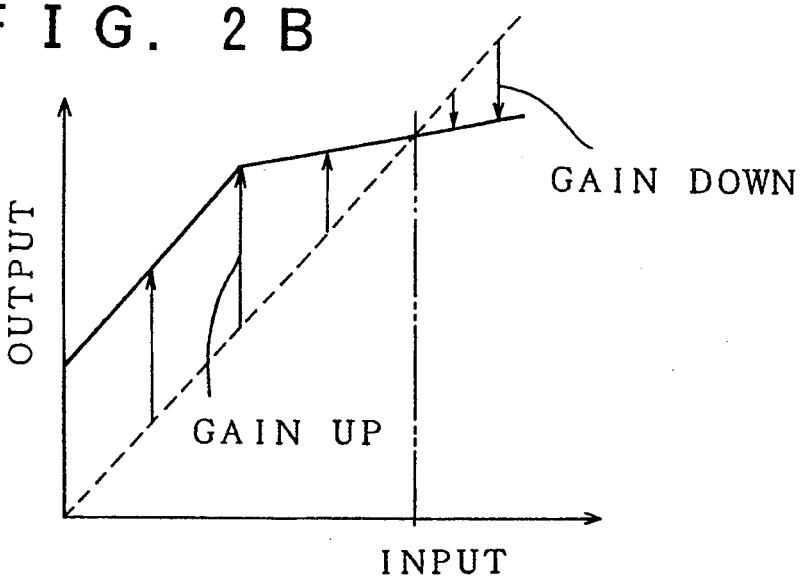
Figure 3:
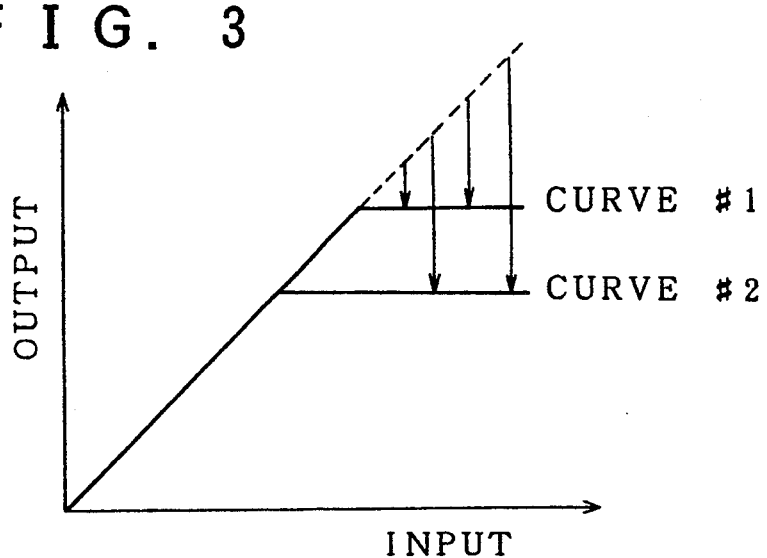
FIG. 3 shows an example of an input-output characteristic table for a limiter.
Figure 5:
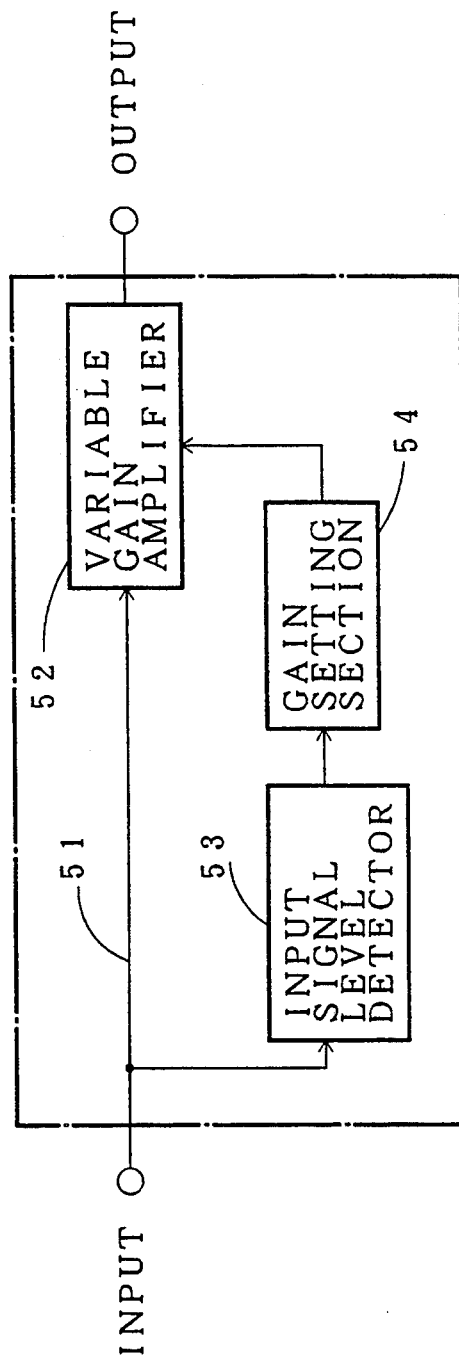
FIG. 5 shows a compressor used in a conventional audio system.

An embodiment of the invention will now be described with reference to the drawings. FIG. 1A shows an embodiment of a compressor 10 for an audio system according to the invention. In the figure, a variable gain amplifier 1 is an amplifier whose gain may be controllably varied with a gain controlling signal. The variable gain amplifier 1 is in a signal line 2. An input signal level detector 3 detects the level of an input signal to the variable gain amplifier 1 and sends the detection result to a gain setting section 4. The gain setting section 4 has two input-output characteristic tables 41 and 42 as shown in FIG. 2A and FIG. 2B, respectively. The respective tables 41 and 42 are provided for predetermined speaker output settings, respectively, so that a characteristic curve suitable for optimum compression is selected for a given range of speaker output setting.

FIG. 2A shows a curve for relatively high levels of loudness or speaker output and FIG. 2B for relatively low levels. In the figures, the dotted lines show the output level of the amplifier 1 if the gain is unchanged for all levels of input. Arrows facing upward indicate the increases in gain of the amplifier t while arrows facing downward represent the decrease in gain. When the speaker output level is high, the sound level radiated from the speaker is high not requiring increased gain for quieter parts of the tune. It should be noted that the increase in quieter parts shown in FIG. 2A is less than that shown in FIG. 2B. It should also be noted that the gain is decreased at lower input levels in FIG. 2A than in FIG. 2B.

A table selecting section 5 receives a speaker output setting signal from a speaker output adjusting section 6 of the audio system and selects a corresponding one of the two input-output characteristic tables 41 and 42 stored in the gain setting section 4. The speaker output adjusting section 6 takes the form of, for example, a well known electronic variable resistor used for adjusting the output power of a power amplifier. For digital audio systems such as CD players and DAT, the input signal is in a digital form. Thus, the compressor 10 shown in FIG. 1A may be arranged by using a DSP (digital signal processing.) In this case, adding an A/D converter 7 as shown in FIG. 1B permits to directly receive an analog signal.

Operation

The operation of the embodiment will now be described as follows:

When the audio system is turned on, the volume adjusting section 6 supplies the table selecting section with a volume setting signal indicating a volume level to be radiated from the speaker. According to the speaker output setting signal, the table selecting section 5 selects one of the two input-output characteristic tables 41 and 42. The description hereinafter assumes that the table 41 corresponding to FIG. 2A is selected. The input signal to the compressor is split to the variable gain amplifier 1 and the input signal level detector 3. The detector 3 detects the level of the input signal and sends it to the gain setting section 4. The section 4 receives the detection level from the detector 3 and determines a corresponding gain from the table 41 in FIG. 2A so as to set the variable gain amplifier for the thus determined gain. Thus, the variable gain amplifier 1 is controllably set its gain so that the input signal is amplified with thus determined gain. In this manner, the input signal undergoes optimum signal compression under input-output characteristic shown in FIG. 2A in accordance with the speaker output setting of the audio system.

For the compressor in the form of software, the curves of the respective input-output characteristics are determined through the following calculation operation. In this embodiment, the input and output signals are approximated as being in a linear relation in a plane having a logarithmic coordinate and a logarithmic ordinate.

A straight line in a log-log plane, the input-to-output relation is given by equation (1) as follows:

$$20\log y = 20 \cdot a \cdot \log X + b \quad (1)$$

where y is an output signal, X is an input signal, a is a slope of the line, and b is the magnitude of output signal for an input of 0 dB. Thus, we obtain the following relation from equation (1).

$$y = 10^{b/20} \cdot X^a \quad (2)$$

In order to carry out the calculation using equation (2) in DSP, the input X is multiplied by a gain k by the multiplier where k is given as follow:

$$k = 10^{b/20} \cdot X^{a-1} \quad (3)$$

In other words, equation (2) is the same as multiplying the input by a gain k.

$$y = 10^{b/20} \cdot X^a = 10^{b/20} \cdot X^{a-1} \cdot X = kX \quad (4)$$

However, DSP is not capable of directly performing exponential multiplication of the variable X. Thus, k in equation (3) is expanded in Taylor series so that the equation is expressed in a multiplication form. For example, k may be expanded in a third order approximation as follows:

$$k = k_1 + k_2 X + k_3 X^2 + k_4 X^3 \quad (5)$$

The respective coefficients $k_i (i=1, 2, 3, 4)$ can be obtained previously from the equations below. Thus, the respective coefficients $k_i$ for respective output characteristic tables are stored in corresponding RAMs, respectively, so that equations (4) and (5) may be utilized to calculate the output signal y.

$$k1 = -10^{b/20} \cdot X_0^{a-1} \frac{(a-2)(a-3)(a-4)}{6}$$

$$k2 = -10^{b/20} \cdot X_0^{a-2} \frac{(a-1)(a-3)(a-4)}{6}$$

$$k3 = -10^{b/20} \cdot X_0^{a-3} \frac{(a-1)(a-2)(a+2)}{6}$$

$$k4 = -10^{b/20} \cdot X_0^{a-4} \frac{(a-1)(a-2)(a-3)}{6}$$

The above values of $k_i$ are the result of Taylor series expansion in the proximity of $X = X_o$ where $X_o$ is set such that the gain error of Taylor series expansion is minimized. In this manner, the employment of DSP allows to readily alter the input-output tables by simply rewriting the coefficients stored in the RAM. This makes it possible to construct a system with high degree of freedom.

Figure 4:
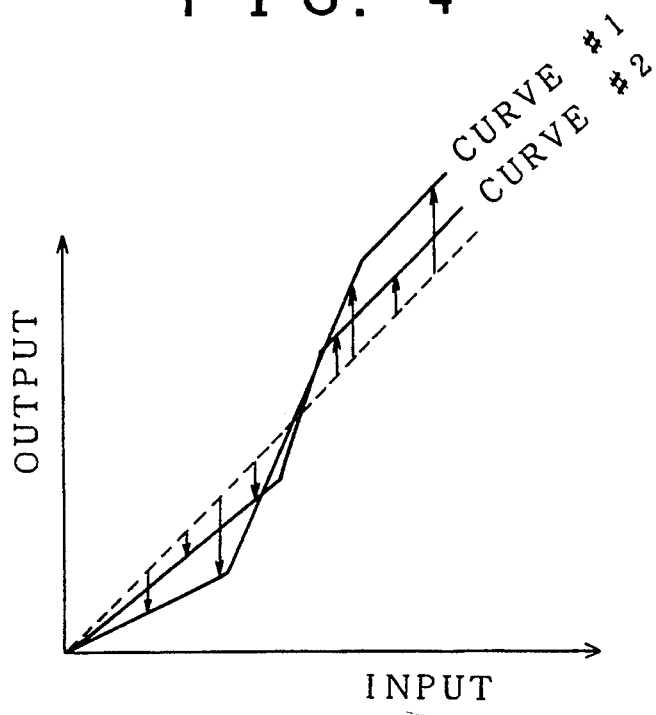
FIG. 4 shows an example of an input-output characteristic table for an expander.
Figure 6:
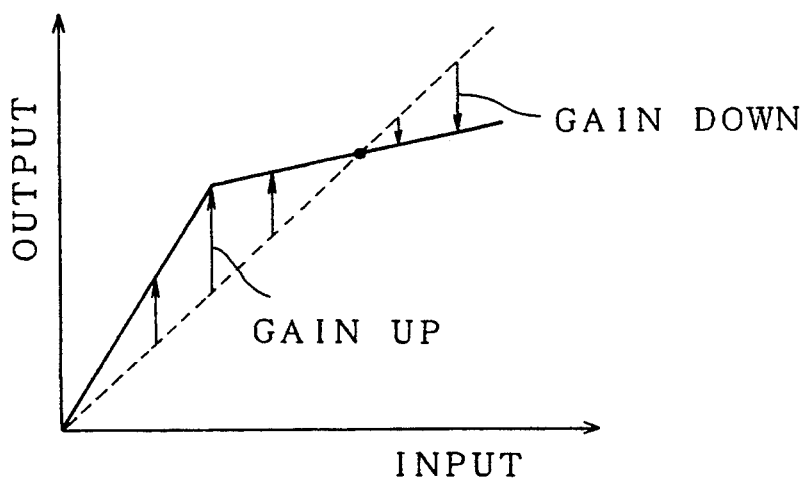
FIG. 6 shows an example of an input-output characteristic of a conventional audio system.

Although the embodiment has been described in terms of the gain setting section 4 having two input-output characteristic tables 41 and 42 shown in FIGS. 2A and 2B, the number of tables depends on the number of subdivided loudness levels or speaker output. While the embodiment in FIG. 1A has been described with respect to a compressor, the invention may be modified so that the gain setting section 4 stores an input-output characteristic table shown in FIG. 4, in which case the embodiment in FIG. 1A may be utilized as a limiter or an expander.

What is claimed is:

1. A signal processing circuit for an audio apparatus wherein a user sets a selected volume level, said signal processing circuit comprising:

an audio apparatus output adjusting section for setting said selected volume level;

a variable gain amplifier placed in a signal line for amplifying an input signal to output an amplified signal, said variable gain amplifier having a gain adapted to be varied in accordance with a gain controlling signal supplied thereto;

a gain setting section having a plurality of tables of input-output characteristics for said variable gain amplifier;

an input signal level detector for detecting a level of said input signal; and a table selecting section, responsive to a volume setting signal supplied from said audio apparatus output adjusting section, for selecting one of said plurality of tables of input-output characteristics in accordance with said selected volume level of said audio apparatus, wherein a selected input-output characteristic is supplied from the selected one of said plurality of tables of input-output characteristics to said table selecting section in accordance with an output signal from said input signal level detector, said table selecting section supplying said selected input-output characteristic to said variable gain amplifier so as to set said variable gain amplifier for a gain corresponding to said selected input-output characteristic.

2. A signal processing circuit according to claim 1, wherein said output signal from said input signal level detector is indicative of the input signal level to said gain setting section.

3. A signal processing circuit according to claim 1, wherein said input signal is a digital signal and is digitally processed.

4. A signal processing circuit according to claim 3, wherein said signal processing circuit further comprises an A/D converter for converting an analog signal into a digital signal, said input signal being the digital signal outputted from said A/D converter.

5. A signal processing circuit according to claim 1, wherein said plurality of input-output characteristics causes said variable gain amplifier to operate as a compressor.

6. A signal processing circuit according to claim 1, wherein said plurality of input-output characteristics causes said variable gain amplifier to operate as an expander.

7. A signal processing circuit according to claim 1, wherein said plurality of input-output characteristics causes said variable gain amplifier to operate as a limiter.

* * * * *